(12) United States Patent
Aitken et al.

(10) Patent No.: US 7,829,147 B2
(45) Date of Patent: Nov. 9, 2010

(54) HERMETICALLY SEALING A DEVICE WITHOUT A HEAT TREATING STEP AND THE RESULTING HERMETICALLY SEALED DEVICE

(75) Inventors: Bruce Gardiner Aitken, Corning, NY (US); Shari Elizabeth Koval, Beaver Dams, NY (US); Mark Alejandro Quesada, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 246 days.

(21) Appl. No.: 12/072,784

(22) Filed: Feb. 28, 2008

(65) Prior Publication Data

US 2008/0149924 A1 Jun. 26, 2008

Related U.S. Application Data

(63) Continuation-in-part of application No. 11/820,855, filed on Jun. 21, 2007, now Pat. No. 7,722,929, and a continuation-in-part of application No. 11/803,512, filed on May 15, 2007, now abandoned, and a continuation-in-part of application No. 11/207,691, filed on Aug. 18, 2005.

(51) Int. Cl.
*B05D 3/02* (2006.01)
*C23C 14/00* (2006.01)

(52) U.S. Cl. ............ 427/376.1; 427/372.2; 204/192.29; 204/298.12

(58) Field of Classification Search .............. 427/376.1, 427/372.2; 204/192.29, 298.12
See application file for complete search history.

(56) References Cited

U.S. PATENT DOCUMENTS

| 3,622,439 A | 11/1971 | Manne et al. ............... 161/184 |
| 3,720,097 A | 3/1973 | Kron ............................. 73/55 |
| 3,795,976 A | 3/1974 | Ikeda |
| 3,916,048 A | 10/1975 | Walles ......................... 428/35 |
| 3,932,693 A | 1/1976 | Shaw et al. ................. 428/518 |
| 4,040,874 A | 8/1977 | Yerman |
| 4,077,588 A | 3/1978 | Hurst .......................... 244/31 |

(Continued)

FOREIGN PATENT DOCUMENTS

DE 2431917 1/1976

(Continued)

OTHER PUBLICATIONS

A. Köhler et al., "Fluorescence and Phosphorescence in Organic Materials", Advanced Engineering Materials, 2002, vol. 4, No. 7, pp. 453-459.

(Continued)

*Primary Examiner*—Shamim Ahmed
(74) *Attorney, Agent, or Firm*—Kevin M. Able

(57) ABSTRACT

A method for hermetically sealing a device without performing a heat treatment step and the resulting hermetically sealed device are described herein. The method includes the steps of: (1) positioning the un-encapsulated device in a desired location with respect to a deposition device; and (2) using the deposition device to deposit a sealing material over at least a portion of the un-encapsulated device to form a hermetically sealed device without having to perform a post-deposition heat treating step. For instance, the sealing material can be a $Sn^{2+}$-containing inorganic oxide material or a low liquidus temperature inorganic material.

10 Claims, 3 Drawing Sheets

U.S. PATENT DOCUMENTS

| | | | |
|---|---|---|---|
| 4,314,031 A | 2/1982 | Sanford et al. | 501/44 |
| 4,374,391 A | 2/1983 | Camlibel et al. | 357/17 |
| 4,379,070 A | 4/1983 | Tick | 252/301.16 |
| 4,702,963 A | 10/1987 | Phillips et al. | 428/426 |
| 4,740,412 A | 4/1988 | Hocker et al. | 428/194 |
| 4,802,742 A | 2/1989 | Ichikawa et al. | 350/339 |
| 4,859,513 A | 8/1989 | Gibbons et al. | 428/34.2 |
| 5,084,356 A | 1/1992 | Deak et al. | 428/458 |
| 5,089,446 A | 2/1992 | Cornelius et al. | |
| 5,110,637 A | 5/1992 | Ando et al. | 428/34 |
| 5,110,668 A | 5/1992 | Minnick | 428/215 |
| 5,180,476 A | 1/1993 | Ishibashi et al. | 204/192.29 |
| 5,183,684 A | 2/1993 | Carpenter | 427/574 |
| 5,211,995 A | 5/1993 | Kuehnle et al. | 427/570 |
| 5,324,572 A | 6/1994 | Kuechler et al. | 428/215 |
| 5,407,713 A | 4/1995 | Wilfong et al. | 428/34.1 |
| 5,462,779 A | 10/1995 | Misiano et al. | 428/34.7 |
| 5,478,618 A | 12/1995 | Rosen | 428/35.4 |
| 5,567,488 A | 10/1996 | Allen et al. | 428/34.1 |
| 5,610,742 A | 3/1997 | Hinata et al. | 349/122 |
| 5,641,559 A | 6/1997 | Namiki | 408/216 |
| 5,645,923 A | 7/1997 | Matsuo et al. | 428/216 |
| 5,736,207 A | 4/1998 | Walther et al. | 428/34.7 |
| 5,792,550 A | 8/1998 | Phillips et al. | 428/336 |
| 5,900,285 A | 5/1999 | Walther et al. | 427/491 |
| 6,077,928 A | 6/2000 | Suh et al. | 528/170 |
| 6,083,313 A | 7/2000 | Venkatraman et al. | 106/287.14 |
| 6,162,892 A | 12/2000 | Kobayashi et al. | 528/310 |
| 6,171,663 B1 | 1/2001 | Hanada et al. | 428/1 |
| 6,171,703 B1 | 1/2001 | Haluska | 428/446 |
| 6,193,379 B1 | 2/2001 | Tonar et al. | 359/603 |
| 6,207,488 B1 | 3/2001 | Hwang et al. | 438/240 |
| 6,211,560 B1 | 4/2001 | Jimenez et al. | 257/451 |
| 6,235,579 B1 | 5/2001 | Lou | 438/253 |
| 6,244,441 B1 | 6/2001 | Ahlgren | 206/522 |
| 6,249,014 B1 | 6/2001 | Bailey | 257/295 |
| 6,268,695 B1 | 7/2001 | Affinito | 313/504 |
| 6,271,150 B1 | 8/2001 | Croswell et al. | 438/760 |
| 6,288,415 B1 | 9/2001 | Leong et al. | 257/94 |
| 6,294,420 B1 | 9/2001 | Tsu et al. | 438/239 |
| 6,306,783 B1 | 10/2001 | Yamanaka | 501/15 |
| 6,321,571 B1 | 11/2001 | Themont et al. | 65/155 |
| 6,350,529 B1 | 2/2002 | Germain et al. | 428/476.3 |
| 6,355,125 B1 | 3/2002 | Tahon et al. | 156/99 |
| 6,403,176 B1 | 6/2002 | Patouraux et al. | 428/35.2 |
| 6,413,645 B1 | 7/2002 | Graff et al. | 428/446 |
| 6,465,101 B1 | 10/2002 | MacGregor et al. | 428/412 |
| 6,486,549 B1 | 11/2002 | Chiang | 257/723 |
| 6,492,026 B1 | 12/2002 | Graff et al. | 428/411.1 |
| 6,522,067 B1 | 2/2003 | Graff et al. | 313/512 |
| 6,524,698 B1 | 2/2003 | Schmoock | 428/336 |
| 6,528,442 B1 | 3/2003 | Kuwano et al. | 501/41 |
| 6,530,477 B1 | 3/2003 | Martorano et al. | 206/524.2 |
| 6,623,861 B2 | 9/2003 | Martin et al. | 428/412 |
| 6,635,989 B1* | 10/2003 | Nilsson et al. | 313/512 |
| 6,660,409 B1 | 12/2003 | Furukawa et al. | 428/690 |
| 6,664,730 B2 | 12/2003 | Weaver | 313/504 |
| 6,720,097 B2 | 4/2004 | Ohkawa et al. | 428/701 |
| 6,720,203 B2 | 4/2004 | Carcia et al. | 438/99 |
| 6,740,394 B2 | 5/2004 | Jacobsen et al. | 428/216 |
| 6,740,430 B2* | 5/2004 | Ueno et al. | 428/690 |
| 6,866,901 B2 | 3/2005 | Burrows et al. | 428/1.5 |
| 6,873,101 B2 | 3/2005 | Nilsson et al. | 313/512 |
| 6,991,506 B2 | 1/2006 | Yamada et al. | 445/24 |
| 7,015,640 B2 | 3/2006 | Schaepkens et al. | 313/506 |
| 7,034,457 B2 | 4/2006 | Iwase et al. | 313/512 |
| 7,045,951 B2 | 5/2006 | Kawase et al. | 313/504 |
| 7,126,269 B2 | 10/2006 | Yamada et al. | 313/504 |
| 7,169,003 B2 | 1/2007 | Iwase et al. | 445/23 |
| 7,198,832 B2 | 4/2007 | Burrows et al. | 428/1.5 |
| 2001/0005585 A1 | 6/2001 | Ashihara et al. | 435/7.95 |
| 2001/0013756 A1 | 8/2001 | Mori et al. | 313/512 |
| 2001/0033135 A1 | 10/2001 | Duggal et al. | 313/506 |
| 2001/0038894 A1 | 11/2001 | Komada | 428/34.6 |
| 2001/0054436 A1 | 12/2001 | Mukai et al. | 136/256 |
| 2002/0013042 A1 | 1/2002 | Morkoc | 438/604 |
| 2002/0019303 A1* | 2/2002 | Yamanaka | 501/17 |
| 2002/0037418 A1 | 3/2002 | Peiffer et al. | 428/458 |
| 2002/0041443 A1 | 4/2002 | Varaprasad et al. | 359/603 |
| 2002/0074553 A1 | 6/2002 | Starikov et al. | 257/77 |
| 2002/0076154 A1 | 6/2002 | Maisenhoelder et al. | 385/37 |
| 2002/0110692 A1 | 8/2002 | Suzuki et al. | 428/411.1 |
| 2002/0114937 A1 | 8/2002 | Albert et al. | 428/304.4 |
| 2002/0122649 A1 | 9/2002 | Shimizu et al. | 385/129 |
| 2002/0127341 A1 | 9/2002 | Li | 427/385.5 |
| 2002/0140347 A1 | 10/2002 | Weaver | 313/506 |
| 2002/0142116 A1 | 10/2002 | Jud et al. | 428/35.3 |
| 2002/0160137 A1 | 10/2002 | Varma | 428/35.7 |
| 2002/0180924 A1 | 12/2002 | Sobrinho | 349/158 |
| 2003/0000826 A1 | 1/2003 | Krempel-Hesse et al. | 204/173 |
| 2003/0006697 A1 | 1/2003 | Weaver | 313/503 |
| 2003/0019517 A1 | 1/2003 | McFarland | 136/256 |
| 2003/0020099 A1 | 1/2003 | Taylor | 257/215 |
| 2003/0022919 A1 | 1/2003 | Ayers et al. | 512/317 |
| 2003/0032039 A1 | 2/2003 | Cunningham et al. | 435/6 |
| 2003/0044552 A1 | 3/2003 | Komada | 428/35.7 |
| 2003/0047353 A1 | 3/2003 | Yamaguchi et al. | 174/260 |
| 2003/0049942 A1 | 3/2003 | Haukka et al. | 438/778 |
| 2003/0068534 A1 | 4/2003 | Ohkawa et al. | 428/701 |
| 2003/0075753 A1 | 4/2003 | Chu | 257/308 |
| 2003/0080678 A1 | 5/2003 | Kim et al. | 313/504 |
| 2003/0085652 A1 | 5/2003 | Weaver | 313/506 |
| 2003/0087513 A1 | 5/2003 | Noguchi et al. | 438/627 |
| 2003/0143423 A1 | 7/2003 | McCormick et al. | 428/690 |
| 2003/0152803 A1 | 8/2003 | Acchione | 428/690 |
| 2003/0155151 A1 | 8/2003 | Hermanns et al. | 174/260 |
| 2003/0155860 A1 | 8/2003 | Choi et al. | 313/498 |
| 2003/0165696 A1 | 9/2003 | Namiki et al. | 428/446 |
| 2003/0183915 A1 | 10/2003 | Scheifers et al. | 257/682 |
| 2003/0184219 A1 | 10/2003 | Duggal et al. | 313/506 |
| 2003/0192587 A1 | 10/2003 | Guzman et al. | |
| 2003/0193057 A1 | 10/2003 | Humbs et al. | 257/88 |
| 2003/0193286 A1 | 10/2003 | Ottermann et al. | 313/506 |
| 2003/0197197 A1 | 10/2003 | Brown et al. | 257/200 |
| 2003/0203210 A1 | 10/2003 | Graff | 428/412 |
| 2003/0207500 A1 | 11/2003 | Pichler et al. | 438/127 |
| 2003/0214612 A1 | 11/2003 | Freeman | 349/12 |
| 2003/0219632 A1 | 11/2003 | Schaepkens | 428/698 |
| 2003/0234180 A1 | 12/2003 | Shimizu et al. | 205/80 |
| 2004/0019596 A1 | 1/2004 | Taylor et al. | 707/100 |
| 2004/0021820 A1 | 2/2004 | Sobrinho | 349/158 |
| 2004/0033379 A1 | 2/2004 | Grunlan et al. | 428/515 |
| 2004/0043138 A1* | 3/2004 | Jagannathan et al. | 427/66 |
| 2004/0046497 A1 | 3/2004 | Schaepkens et al. | 313/506 |
| 2004/0046500 A1 | 3/2004 | Stegamat | 313/512 |
| 2004/0051449 A1 | 3/2004 | Klausmann et al. | 313/512 |
| 2004/0067604 A1 | 4/2004 | Ouellet et al. | 438/108 |
| 2004/0075382 A1 | 4/2004 | Stegamat et al. | 313/506 |
| 2004/0092095 A1 | 5/2004 | Nguyen et al. | 438/627 |
| 2004/0097005 A1 | 5/2004 | Daniels et al. | 438/99 |
| 2004/0100176 A1 | 5/2004 | Pichler | 313/112 |
| 2004/0113542 A1 | 6/2004 | Hsiao et al. | 313/504 |
| 2004/0113543 A1 | 6/2004 | Daniels | 313/504 |
| 2004/0115361 A1 | 6/2004 | Aegerter et al. | 427/430.1 |
| 2004/0119403 A1 | 6/2004 | McCormick et al. | 313/506 |
| 2004/0121586 A1 | 6/2004 | Abell | 438/637 |
| 2004/0132606 A1 | 7/2004 | Wolf et al. | 501/66 |
| 2004/0135268 A1 | 7/2004 | Frischknecht | 257/788 |
| 2004/0135503 A1 | 7/2004 | Handa et al. | 313/511 |
| 2004/0140766 A1 | 7/2004 | Nilsson et al. | 313/512 |
| 2004/0151934 A1 | 8/2004 | Schwark et al. | 428/518 |
| 2004/0157426 A1 | 8/2004 | Ouellet et al. | 438/618 |
| 2004/0166239 A1 | 8/2004 | Ohkawa et al. | 427/248.1 |
| 2004/0174115 A1 | 9/2004 | Czeremuszkin et al. | 313/504 |

| | | | | |
|---|---|---|---|---|
| 2004/0195960 | A1 | 10/2004 | Czeremuszkin et al. | 313/504 |
| 2004/0197489 | A1 | 10/2004 | Heuser et al. | 427/535 |
| 2004/0201027 | A1 | 10/2004 | Ghosh | 257/99 |
| 2004/0201348 | A1 | 10/2004 | Anandan | 313/512 |
| 2004/0206953 | A1 | 10/2004 | Morena et al. | 257/40 |
| 2004/0207314 | A1 | 10/2004 | Aitken et al. | 313/504 |
| 2004/0209126 | A1 | 10/2004 | Ziegler et al. | 428/702 |
| 2004/0229051 | A1 | 11/2004 | Schaepkens et al. | 428/447 |
| 2004/0234797 | A1 | 11/2004 | Schwark et al. | 428/474.4 |
| 2004/0239241 | A1 | 12/2004 | Wittmann et al. | 313/511 |
| 2004/0258893 | A1 | 12/2004 | Penttinen et al. | 428/212 |
| 2005/0012448 | A1 | 1/2005 | Ke et al. | 313/504 |
| 2005/0045223 | A1* | 3/2005 | Jenson et al. | 136/248 |
| 2005/0051763 | A1 | 3/2005 | Affinito et al. | 257/3 |
| 2005/0241815 | A1 | 11/2005 | Caze et al. | |
| 2007/0252526 | A1 | 11/2007 | Aitken et al. | 313/512 |

FOREIGN PATENT DOCUMENTS

| | | | |
|---|---|---|---|
| EP | 0225164 | 6/1987 | 27/34 |
| EP | 0135924 | 9/1987 | 27/8 |
| EP | 0151462 | 8/1990 | 27/32 |
| EP | 0288972 | 9/1993 | 27/34 |
| EP | 0394519 | 2/1994 | 1/133 |
| EP | 0588667 | 3/1994 | 27/32 |
| EP | 0638939 | 2/1995 | |
| EP | 0494594 | 10/1995 | 65/40 |
| EP | 0705757 | 4/1996 | 1/40 |
| EP | 0744285 | 12/1999 | 27/32 |
| EP | 0701897 | 4/2001 | 27/8 |
| EP | 1118459 | 7/2001 | 27/32 |
| EP | 1 207 572 | 5/2002 | |
| EP | 1278244 | 1/2003 | |
| EP | 0895013 | 8/2003 | 11/12 |
| EP | 0 977 469 | 9/2003 | |
| EP | 0 726 579 | 11/2003 | |
| EP | 0 775 328 | 3/2004 | |
| EP | 1420041 | 5/2004 | 7/4 |
| EP | 1442067 | 8/2004 | 18/76 |
| EP | 0787824 | 9/2004 | 16/40 |
| EP | 1410902 | 4/2006 | 27/34 |
| EP | 1 965 453 | 9/2008 | |
| JP | 2004/010843 | 1/2001 | |
| JP | 2003/020235 | 1/2003 | |
| JP | 2003/275575 | 9/2003 | |
| JP | 2004/018335 | 1/2004 | |
| JP | 2005/306010 | 11/2005 | |
| WO | WO93/22131 | 11/1993 | |
| WO | WO97/22536 | 6/1997 | 65/40 |
| WO | WO99/19229 | 4/1999 | 65/42 |
| WO | WO 00/20536 | 4/2000 | |
| WO | WO00/66794 | 11/2000 | 7/20 |
| WO | WO 01/05205 | 1/2001 | |
| WO | WO 01/65167 | 9/2001 | |
| WO | WO 01/83067 | 11/2001 | |
| WO | WO 02/36647 | 5/2002 | |
| WO | WO03-087427 | 10/2003 | 183/4 |
| WO | WO 2004/046767 | 6/2004 | |
| WO | WO 2004/079781 | 9/2004 | |
| WO | WO 2004/094321 | 11/2004 | |
| WO | WO 2004/095597 | 11/2004 | |
| WO | WO2004/105149 | 12/2004 | 51/10 |

OTHER PUBLICATIONS

R.A. Mathies et al., "Optimization of High-Sensitivity Fluorescence Detection", Anal. Chem., 1990, vol. 62, pp. 1786-1791.

P.K.H. Ho et al., "All-Polymer Optoelectronic Devices", Science, vol. 285, Jul. 9, 1999, pp. 233-236.

H. Aziz et al., "Degradation Mechanism of Small Molecule-Based Organic Light-Emitting Devices", Science, Mar. 19, 1999, vol. 283, pp. 1900-1902.

P.E. Burrows et al., "Reliability and degradation of organic light emitting devices", Appl. Phys. Lett., vol. 65, No. 23, Dec. 5, 1994, pp. 2922-2924.

P.A. Tick et al., "Optical Waveguides from Low Melting Temperature Glasses with Organic Dyes", SPIE, vol. 1775, Nonlinear Optical Properties of Organic Materials V, 1992, pp. 391-401.

Hood Chatham, "Oxygen Diffusion Barrier Properties of Transparent Oxide Coatings on Polymeric Substrates", Surface and Coatings Technology, vol. 78, 1996, pp. 1-9.

D.B. Curliss et al., "Cure Reaction Pathways of Bismaleimide Polymers: A Solid-State $^{15}$N NMR Investigation", Macromolecules, 1998, vol. 31, pp. 6776-6782.

N. Regnier et al., "Solid-State $^{13}$C-NMR Study on Bismaleimide/Diamine Polymerization: Structure, Control of Particle Size, and Mechanical Properties", Journal of Applied Polymer Science, vol. 78, 2000, pp. 2379-2388.

A. Ashok Kumar et al., "Synthesis and Characterization of Siliconized Epoxy-1, 3-bis(maleimido)benzene Intercrosslinked Matrix Materials", Polymer, vol. 43, 2002, pp. 693-702.

M. Sava, "Synthesis of Bismaleimides with Ester Units and Their Polymerization with Diamines", Journal of Applied Polymer Science, vol. 84, 2002, pp. 750-757.

MIT Internet Class 6.976, Lecture #7, "Special Topics in Flat Panel Display", Spring 2001, http://hackman.mit.edu\6976\LIIandouts\Lecture%207.pdf\.

A.C. Misra et al., "Synthesis and properties of octafluoro-benzidine bis-maleimide and of it reaction products with fluorinated diamines", Polymer, 1992, vol. 33, No. 5, pp. 1083-1089.

A.C. Misra et al., "Synthesis and properties of some new fluorine-containing polyimides", Polymer, 1992, vol. 33, No. 5, pp. 1078-1082.

J.E. White et al., "Polymerization of N,N'-bismaleimido-4,4'-diphenylinethane with arenedithiols. Synthesis of some new polyimidosulphides", Polymer, 1984, vol. 25, pp. 850-854.

Kolosov, D., et al., Direct observation of structural changes in organic light emitting devices during degradation. Journal of Applied Physics, 1001. 90(7).

Liew, F.Y., et al., Investigation of the sites of dark spots in organic light-emitting devices. Applied Physics Letters, 1000. 77(17).

Forsythe, Eric, W., Operation of Organic-Based Light-Emitting Devices, in Society for Information Device (SID) 40$^{th}$ anniversary Seminar Lecture Notes, vol. 1, Seminar M5, Hynes Convention Center, Boston, MA, May 20 and 24, (1002).

Nisato, et al "P-88: Thin Film Encapsulation for OLEDs: Evaluation of Multi-layer Barriers using the Ca Test", SID 03 Digest, pp. 550-553.

PCT International Search Report for International Application No. PCT/US2006/030670 dated Dec. 19, 2006.

U.S. Appl. No. 11/509,445, filed Aug. 24, 2006 titled "Tin Phosphate Barrier Film, Method, and Apparatus".

Young, R., *Flat panel display market outlook: From cyclicality to maturity*, in NPD Breakfast with the Experts, D. Ross Young—President, ditor. 2006, DisplaySearch, www.displaysearch.com.

Nisato, G., et al., *Evaluating high performance diffusion barriers: the calcium test*. In 8$^{th}$ International Display Workshop. 2001. Nagoya, Japan.

Burrows, P.E., et al., *Gas Permeation and Lifetime Tests on Polymer-Based Barrier Coatings*, in SPIE Annual Meeting. 2000, SPIE.

Walther et al; "Multilayer Barrier Coating System Produced by Plasma-Impulse Chemical Vapor Deposition (PICVD)"; Surface and Coatings Technology, vo. 80, pp. 200-202, 1996.

Giefers, H. et al; (2005), Kinetics of the disproportionation of $SnO_1$ Solid State Ionics 176, pp. 199-207, Elsevier.

Titova, Z.P. et al; 1964; Journal of Applied Chemistry USSR, 37 (10-12), pp. 2129.

N. Sakamoto, et al., "Properties and structure of glasses in the System $SnF_2$-$P_2O_5$", Journal of the Japan Institute of Metals, 1990, vol. 54, No. 12, pp. 1363-1368.

G.L. Graff, at al., "Barrier Layer Technology for Flexible Displays," Flexible Flat Panel Displays, 2005, John Wiley & Sons, Ltd., pp. 58-77.

X.J. Xu, et al., "Properties and structure of Sn-P-O-F glasses," Physics and Chemistry of Glasses, Oct. 1990, vol. 31, No. 5, pp. 183-187.

C.M. Shaw, et al., "Preparation and properties of stannous fluorophosphates glasses," Physics and Chemistry of Glasses, Apr. 1988, vol. 29, No. 2, pp. 49-53.

P.A. Tick, "Water durable glasses with ultra low melting temperatures," Physics and Chemistry of Glasses, Dec. 1984, vol. 25, No. 6, pp. 149-154.

* cited by examiner

HERMETICALLY SEALING A DEVICE WITHOUT A HEAT TREATING STEP AND THE RESULTING HERMETICALLY SEALED DEVICE

CLAIMING BENEFIT OF CO-PENDING U.S. APPLICATIONS

This patent application is a continuation-in-part application of co-assigned U.S. patent application Ser. Nos. 11/820,855, filed, Jun. 21, 2007 now U.S. Pat. No. 7,722,929, which is a continuation-in-part of 11/207,691, filed Aug. 18, 2005, and U.S. patent application Ser. No. 11/803,512, filed May 15, 2007 now abandoned. The contents of these documents are hereby incorporated by reference herein.

TECHNICAL FIELD

The present invention relates to a method for hermetically sealing a device without needing to perform a heat treating step and the resulting hermetically sealed device. Examples of the hermetically sealed device include a light-emitting device (e.g., organic emitting light diode (OLED) device), a photovoltaic device, a thin-film sensor, an evanescent waveguide sensor, a food container and a medicine container.

BACKGROUND

Transport of oxygen and/or water through laminated or encapsulated materials and their subsequent attack on an inner material within a device represents two of the more common degradation mechanisms associated with many devices including, for example, light-emitting devices (OLED devices), thin-film sensors, evanescent waveguide sensors, food containers and medicine containers. For a detailed discussion about the problems associated with the penetration of oxygen and water into the inner layers (cathode and electro-luminescent materials) of an OLED device, reference is made to the following documents:

Aziz, H., Popovic, Z. D., Hu, N. X., Hor, A. H., and Xu, G. "Degradation Mechanism of Small Molecule-Based Organic Light-Emitting Devices", Science, 283, pp. 1900-1902, (1999).

Burrows, P. E., Bulovic., V., Forrest, S. R., Sapochak, L. S., McCarty, D. M., Thompson, M. E. "Reliability and Degradation of Organic Light Emitting Devices", Applied Physics Letters, 65(23), pp. 2922-2924.

Kolosov, D., et al., Direct observation of structural changes in organic light emitting devices during degradation. Journal of Applied Physics, 1001. 90(7).

Liew, F. Y., et al., Investigation of the sites of dark spots in organic light-emitting devices. Applied Physics Letters, 1000. 77(17).

Chatham, H., "Review: Oxygen Diffusion Barrier Properties of Transparent Oxide Coatings on Polymeric Substrates", 78, pp. 1-9, (1996).

It is well known that unless something is done to minimize the penetration of oxygen and water into an OLED device, then their operating lifetime will be severely limited. As a result, much effort has been expended to minimize the penetration of oxygen and water into an OLED device so as to help drive the OLED operation towards a 40 kilo-hour lifetime, the level generally regarded as necessary so OLED devices can overtake older device technologies such as LCD displays as discussed in the following document:

Forsythe, Eric, W., "Operation of Organic-Based Light-Emitting Devices, in Society for Information Device (SID) 40$^{th}$ anniversary Seminar Lecture Notes, Vol. 1, Seminar M5, Hynes Convention Center, Boston, Mass., May 20 and 24, (1002).

The more prominent efforts to date that have been performed to help extend the lifetime of OLED devices include gettering, encapsulating and using various sealing techniques. In fact, one common way for sealing an OLED device today is to apply and heat-treat (or UV treat) different types of epoxies, inorganic materials and/or organic materials to form a seal on the OLED device. For example, Vitex Systems manufactures and sells a coating under the brand name of Barix™ which is a composite based approach where alternate layers of inorganic materials and organic materials are used to seal the OLED device. Although these types of seals provide some level of hermetic behavior, they can be very expensive and there are still many instances in which they have failed over time to prevent the diffusion of oxygen and water into the OLED device.

To address this sealing problem, the assignee of the present invention has developed several different sealing techniques and sealing materials that can be used to hermetically seal an OLED device (or other type of device)(see the aforementioned U.S. patent application Ser. Nos. 11/207,691, 11/803, 512 and 11/820,855). Although these sealing techniques and sealing materials work well to hermetically seal an OLED device (or other types of devices) there was still a desire to improve upon these sealing techniques and sealing materials so that one can more effectively hermetically seal an OLED device (or other type of device). This particular need and other needs have been satisfied by the present invention.

SUMMARY

In one aspect, the present invention includes a method for hermetically sealing a device comprising the steps of: (1) positioning an un-encapsulated device in a desired location with respect to a deposition device; and (2) using the deposition device to deposit a sealing material over at least a portion of the un-encapsulated device to form a hermetically sealed device without having to perform a post-deposition heat treating step. In one embodiment, the sealing material is a $Sn^{2+}$-containing inorganic oxide material or a low liquidus temperature inorganic material.

In another aspect, the present invention includes a device comprising a substrate plate, at least one component, and a non-heat treated sealing material, where the at least one component is hermetically sealed between the non-heat treated sealing material and the substrate plate. In one embodiment, the sealing material is a $Sn^{2+}$-containing inorganic oxide material or a low liquidus temperature inorganic material.

In yet another aspect, the present invention includes an organic emitting light diode (OLED) device comprising a substrate plate, at least one organic light emitting diode, and a non-heat treated sealing material, where the at least one organic light emitting diode is hermetically sealed between the non-heat treated sealing material and the substrate plate. In one embodiment, the sealing material is a $Sn^{2+}$-containing inorganic oxide material or a low liquidus temperature inorganic material.

Additional aspects of the invention will be set forth, in part, in the detailed description, figures and any claims which follow, and in part will be derived from the detailed description, or can be learned by practice of the invention. It is to be understood that both the foregoing general description and the following detailed description are exemplary and explanatory only and are not restrictive of the invention as disclosed.

BRIEF DESCRIPTION OF THE DRAWINGS

A more complete understanding of the present invention may be had by reference to the following detailed description when taken in conjunction with the accompanying drawings wherein.

DETAILED DESCRIPTION

Figure 1:
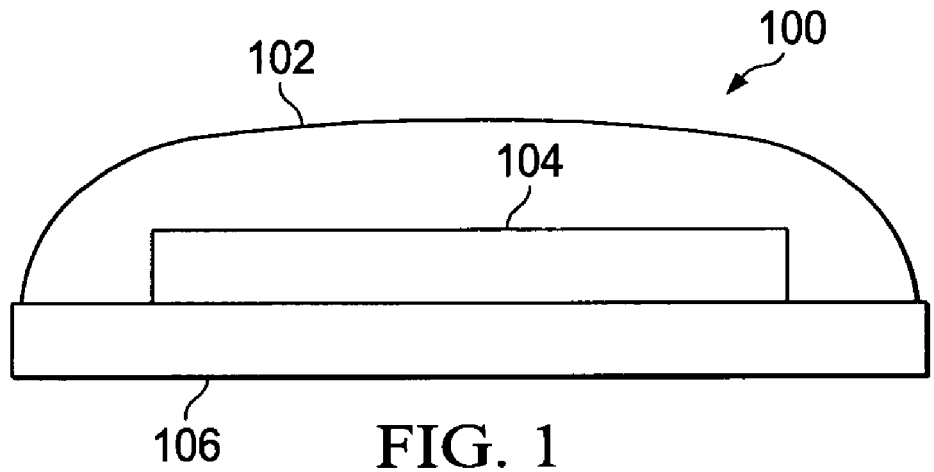
FIG. 1 is a cross-sectional side view of a hermetically sealed device in accordance with the present invention.
Figure 2:
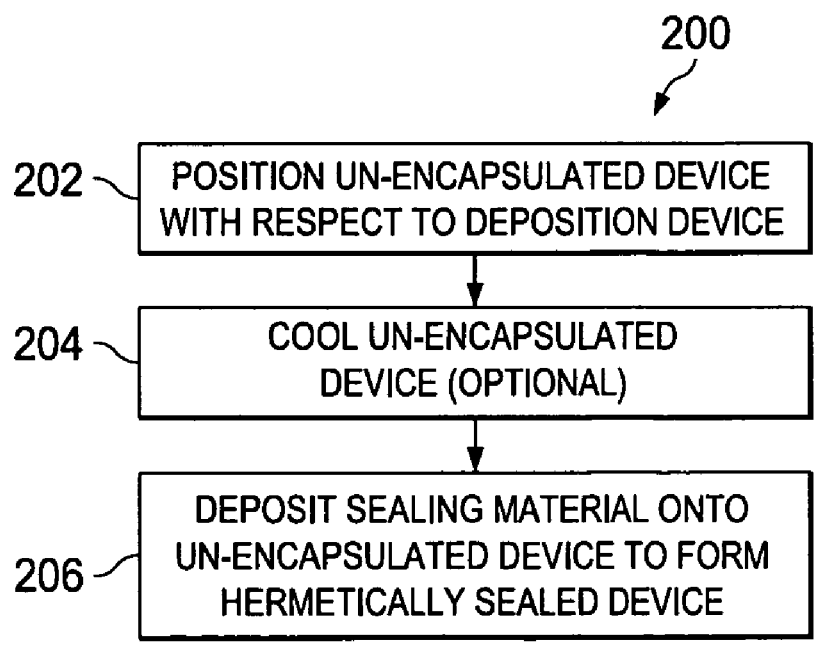
FIG. 2 is a flowchart illustrating the steps of a method for hermetically sealing a device without performing a heat treatment step in accordance with the present invention.

Referring to FIGS. 1-2, there are respectively illustrated a cross-sectional side view of a hermetically sealed device 100 and a flowchart of a non-heat treatment sealing method 200 used to manufacture the hermetically sealed device 100 in accordance with the present invention. As shown in FIG. 1, the non-heat treated hermetically sealed device 100 includes a sealing material 102 (e.g., a $Sn^{2+}$-containing inorganic oxide material 102 or a low liquidus temperature (LLT) inorganic material 102) which was deposited so as to encapsulate and hermetically seal one or more inner layers/components 104 located on a support/substrate 106.

The non-heat treatment sealing method 200 includes a positioning step 202 in which an un-encapsulated device 104 and 106 is placed in a desired location with respect to a deposition device (e.g., see deposition device 300 discussed below with respect to FIG. 3). Optionally, the deposition device may be located in a clean environment (or a cleanroom) where a clean process is practiced to prevent as much as possible the presence of large particulates from contaminating the un-encapsulated device 104 and 106. The specific type of clean environment or cleanroom that could be used depends on the type of device 100 (and its surface dimensions) and the final thickness of the deposited sealing material 102. For instance, the clean environment or cleanroom could be designed to ensure that there are no particulates (or very few particulates) in the atmosphere which have a dimension greater than the final thickness of the sealing material 102 on the device 100. A detailed discussion about the different types of cleanrooms that could be used is provided in the industry standards: (1) US Federal Standard 209 entitled "Cleanroom and Work Station Requirements, Controlled Environments" 1992; and (2) the International Standards Organization TC209. The contents of these two standards are hereby incorporated by reference herein.

The non-heat treatment sealing method 200 has an optional cooling step 204 in which the support/substrate 106 and possibly the inner layer(s)/component(s) 104 of the un-encapsulated device 104 and 106 are cooled to a temperature which is (for example): preferably <15° C., more preferably <10° C. and even more preferably <1° C. An advantage of implementing the optional cooling step 204 is that by cooling the un-encapsulated device 104 and 106 one can then increase the rate that the sealing material 102 could be deposited onto the un-encapsulated device 104 and 106 which decreases the time it takes to hermetically seal the device 100. This is important when one wants to have a high volume operation and manufacture a large number of hermetically sealed devices 100. For a more detailed discussion about this optional cooling step 204, reference is made to the aforementioned U.S. patent application Ser. No. 11/820,855 filed on Jun. 21, 2007 and entitled "Sealing Technique for Decreasing the Time it Takes to Hermetically Seal a Device and the Resulting Hermetically Sealed Device".

In addition, the non-heat treatment sealing method 200 has a deposition step 206 in which the deposition device is used to deposit the sealing material 102 (e.g., $Sn^{2+}$-containing inorganic oxide material 102 or LLT material 102) over the inner layer(s)/component(s) 104 located on top of the support/substrate 106 to form the hermetically sealed device 100. In one embodiment, the sealing material 102 can be deposited over the inner layer(s)/component(s) 104 and the support/substrate 106 at a deposition rate which is (for example): preferably ~5 Å/second, more preferably ~25 Å/second, and even more preferably ~75 Å/second. Plus, the sealing material 102 can be deposited by using any one of variety of processes including, for example, sputtering, flash evaporation, spraying, pouring, frit-deposition, vapor-deposition, dip-coating, painting, rolling (for example using a film of sealing material 102), spin-coating, a co-evaporation process, a soot gun spraying process, a reactive sputtering process, a magnetron radio-frequency (RF) sputtering process, a laser ablation process, or any combination thereof.

If desired, the deposition step 206 can be performed in an inert atmosphere or in a vacuum to help ensure that a water and an oxygen-free condition is maintained throughout the entire sealing process 200. This type of processing environment would help to ensure the robust, long-life operation of organic electronics 104 (for example) that may be located within the hermetically sealed device 100. An important aspect of the non-heat treatment sealing method 200 is that a post deposition heat treatment step is not required to make the hermetically sealed device 100. The advantages associated with using the non-heat treatment sealing method 200 are discussed below with respect to a hermetically sealed OLED device 100.

Examples of different devices 100 that can be protected by the non-heat treated sealing material 102 (e.g., $Sn^{2+}$-containing inorganic oxide material 102 and LLT material 102) include a light-emitting device (e.g., OLED device), a photovoltaic device, a thin-film sensor, an evanescent waveguide sensor, a food container, and a medicine container. If the device 102 is an OLED device 100, then the inner layers 104 include cathode and electro-luminescent materials which form organic light emitting diode(s) 104 that are located on the substrate 106. The organic light emitting diode(s) 104 can be damaged if they are heated above for example 100-125° C. As such, it is very desirable that the sealing method 200 does not require the use of a heat treatment step.

To help implement the non-heat treatment sealing method 200, the sealing material 102 used to encapsulate and hermetically seal the device 100 would preferably be a LLT inorganic material 102 or a $Sn^{2+}$-containing inorganic oxide material 102. These sealing materials 102 are discussed below but for a more detailed discussion about these sealing materials reference is made to the co-assigned and co-pending U.S. patent application Ser. Nos. 11/207,691 and 11/803,512.

The LLT material 102 is useful in the non-heat treatment sealing method 200 because this type of material can be applied such that there is a pore-free film formed on the device 100. In one embodiment, the LLT material 102 has a low liquidus temperature ≦1000° C. (and more preferably ≦600° C. and even more preferably ≦400° C.). The LLT material 102 can include, for example, glass such as tin fluorophosphate glass, tungsten-doped tin fluorophosphate glass, chalcogenide glass, tellurite glass, borate glass and phosphate glass (e.g., alkali Zn or SnZn pyrophosphates). An exemplary tin fluorophosphate glass has the following composition: Sn (20-85 wt %), P (2-20 wt %), O (10-36 wt %), F (10-36 wt %), Nb (0-5 wt %) and at least 75% total of Sn+P+O+F (which can be melted powder targets or sputtered pressed powder targets). These LLT materials 102 are desirable for several different reasons including (for example):

- The LLT material 102 can be devoid of heavy metals and other environmentally undesirable materials.
- The LLT material 102 can be durable and exhibit low dissolution rates when immersed in water at 85° C.
- The LLT material 102 can contain dye molecules and can be doped to levels as high as 8 mM ($4.8 \times 10^{18}$ cm$^{-3}$).
- The LLT phosphate glasses have helium permeability coefficients 4 to 5 orders of magnitude less than that of fused silica.

Alternatively, another LLT material 102 namely tungsten-doped tin fluorophosphate glass could be used in this non-heat treatment sealing method 200 and this material was disclosed in co-assigned U.S. patent application Ser. No. 11/544,262 (the contents of which are incorporated by reference herein). An exemplary tungsten-doped tin fluorophosphate glass has the following composition: (55-75 wt %) Sn, (4-14 wt %) P, (6-24 wt %) O, (4-22 wt %) F, and (0.15-15 wt %) W.

The $Sn^{2+}$-containing inorganic oxide material 102 is useful in the non-heat treatment sealing method 200 because this type of material has the ability to form a hermetic encapsulated coating which protects the device 100. In one embodiment, the $Sn^{2+}$-containing inorganic oxide material 102 has a composition with molar limits 36-100% SnO, 0-45% $SnF_2$, and 0-28% $P_2O_5$ which roughly correspond to the following elemental weight percentages: 59-89 wt % Sn, 0-13 wt % P, 6-25 wt % O, and 0-12 wt % F. In another embodiment, the $Sn^{2+}$-containing inorganic oxide materials 102 include: (1) SnO; (2) SnO and a borate material; (3) SnO and a phosphate material; and (4) SnO and a borophosphate material. For instance, the $Sn^{2+}$-containing inorganic oxide materials 102 can include compositions such as, for example, SnO powder, blended SnO/$P_2O_5$-containing powders (e.g., 80% SnO+20% $P_2O_5$), and blended SnO/$BPO_4$ powders (e.g., 90% SnO+ 10% $BPO_4$). Alternatively, the $Sn^{2+}$-containing inorganic oxide material 102 can include blended compositions that had been melted to form the appropriate sputtering target (e.g., 80% SnO+20% $P_2O_5$). Typically, the $Sn^{2+}$-containing inorganic oxide material 102 contains >50% stannous oxide (and more preferably >70% stannous oxide and even more preferably >80% stannous oxide).

The results associated with testing a candidate tin fluorophosphate glass 102 (LLT material 102) which had the following composition: Sn (22.42 wt %), P (11.48 wt %), O (42.41 wt %), F (22.64 wt %) and Nb (1.05 wt %) that was deposited onto an un-encapsulated device 104 and 106 is discussed below with respect to FIGS. 3-5. In this experiment, the candidate tin fluorophosphate glass 102 underwent a "calcium-only patch" test which was performed to determine how well it inhibited the penetration of oxygen and moisture. Prior to discussing the results of the experiment, a discussion is provided to explain how a calcium-only patch test is set-up and then performed to check the feasibility of the non-heat treatment sealing method 200.

Figure 3:
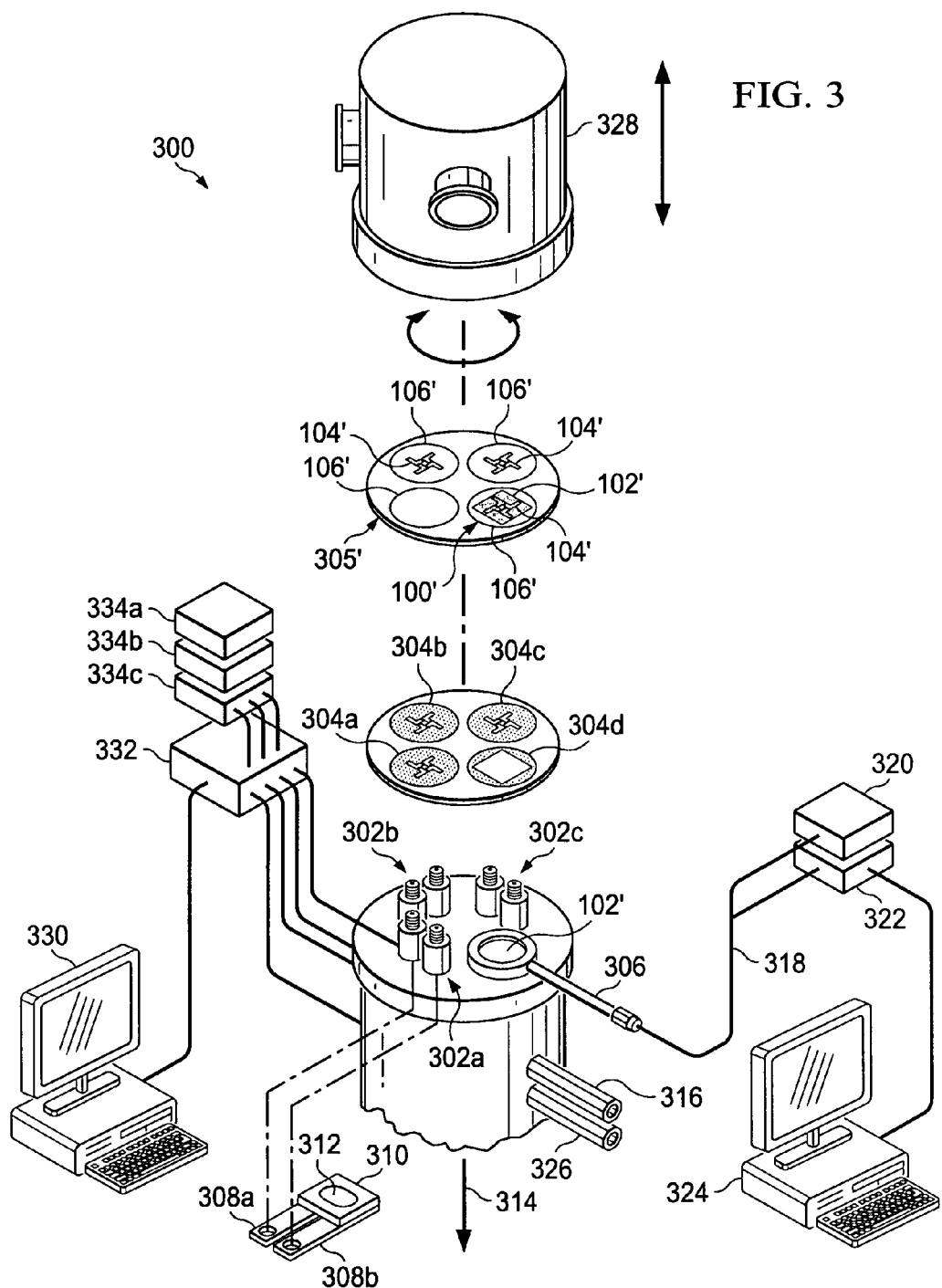
FIG. 3 is a diagram illustrating a single-vacuum chamber which was used to make a calcium-only patch and then used to deposit a sealing material over the calcium-only patch (experimental device) in accordance with the non-heat treatment sealing method of the present invention.

Referring to FIG. 3, there is a schematic diagram illustrating the basic components of a single vacuum chamber 300 that was used to prepare and encapsulate calcium-only patches 100'. As shown, the single-vacuum chamber 300 is equipped with three evaporation boat electrodes 302a, 302b and 302c each of which is associated with an individual shadow mask 304a, 304b and 304c that will be used to evaporate a material (calcium 104') in a unique pattern onto three of the four substrates 106' placed on a platform 305'. The single-vacuum chamber 300 also has a RF sputter gun 306 that will be used to deposit the candidate tin fluorophosphate glass 102' through a mask 304d and encapsulate each of the calcium covered substrates 106' (only one encapsulated calcium-only patch 100' has been shown on the platform 305').

The single-vacuum chamber 300 was designed so it could be cryo-pumped (CTI-8200/Helix; Ma) to operate at pressures ($10^{-6}$-$10^{-5}$ Torr) which are typical for evaporation processes but are also more than adequate for RF sputter deposition conditions (~$10^{-3}$ Torr). Each evaporation boat electrode 302a, 302b and 302c was outfitted with two leads 308a and 308b (in this case copper leads 308a and 308b where only one pair of the leads 308a and 308b have been shown) so they could provide DC currents in the 80-180 Watt range through a vacuum 314 to a boat 310 which holds a calcium shot 312. Typically, the effective resistance of a particular tungsten boat geometry determines the precise wattage which should be used to deposit/evaporate the calcium 312 (which forms the inner layer 104') onto the substrate 106'. In this case, 3"×¾" tungsten boats 310 were selected so stable deposition rates as high as 15 Å/s could be attained. And, a water-cooled 3" diameter cylindrical RF sputtering gun 306 (Onyx-3™, Angstrom Sciences, Pa) was selected and positioned as shown in FIG. 3. The RF sputtering gun 306 has a water coupling 316, an electrical coupling 318 (associated with a power supply 320, feedback control 322 and computer 324) and an argon coupling 326 to be able to provide the desired RF deposition conditions: 30 Watt forward power (~1 Watt reflected power), 20 sccm argon flow leak rate, and a ~1 milliTorr chamber pressure with argon flow.

Prior to depositing the calcium 104 onto the three substrates 106', pellets of calcium shot 312 (Stock#10127 Alfa Aesar which was stored in a nitrogen purge box) were placed onto the 3"×¾" tungsten boats 310. Each boat 310 was clamped firmly between the two copper leads 308a and 308b to complete the DC circuit required for Joule heating and evaporation. The three shadow masks 304a, 304b and 304c containing L-shaped stencil patterns were positioned between the three evaporation boats 302a, 302b and 302c and the three substrates 106' (Corning 1737 glass substrate 106'). The single-vacuum chamber 300 was then closed with a cover 328 and pumped until a vacuum was obtained in the $10^{-6}$-$10^{-5}$ Torr range. Initially, power in the 20-Watt range was delivered to each tungsten boat 310 for approximately 10 minutes then a "pre-soak" step was performed where the power was increased to ~80-125 Watts while depositing each 40 nm thick L-shaped calcium pattern 104' onto three substrates 106'. A computer 330 attached to a thickness monitor 332 and three evaporation power supplies 334a, 334b and 334c (respectively associated with the three evaporation boat electrodes 302a, 302b and 302c) controlled the deposition of the calcium patterns 104' onto the three substrates 106' (note: the platform 305' shown has been rotated after the calcium 104 had been deposited onto the three substrates 106' so the three calcium covered substrates 106' are no longer located directly over the three masks 304a, 304b and 304c).

After the deposition of the calcium patterns 104', the DC current was stopped and one of the patterned substrates 106' was rotated into position above the mask 304d and the RF sputtering gun 306 which contained the candidate tin fluorophosphate glass 102' (see the shown position of the platform 305'). The RF sputtering gun 306 deposited a ~2 micron thick film 102' over the L-shaped calcium patterns 104' on one of the substrates 106' to form the encapsulated calcium-only patch 100'. Of course, this step could be repeated to encapsulate all of the L-shaped calcium patterns 104' on all of the substrates 106' (note: only one encapsulated calcium-only patch 100', two substrates 106' with calcium patterns 104' and one plain substrate 106' on the platform 305' have been shown). In this experiment, 3" sealing targets were prepared at a deposition rate that was estimated to be in a range near 1 Å/second. The RF power, water, and argon were stopped, the cover 328 removed and the encapsulated L-shaped calcium patches 100' was then removed for 85° C./85% RH testing. No post-deposition heat treatment was applied during the encapsulation process.

Figure 4:
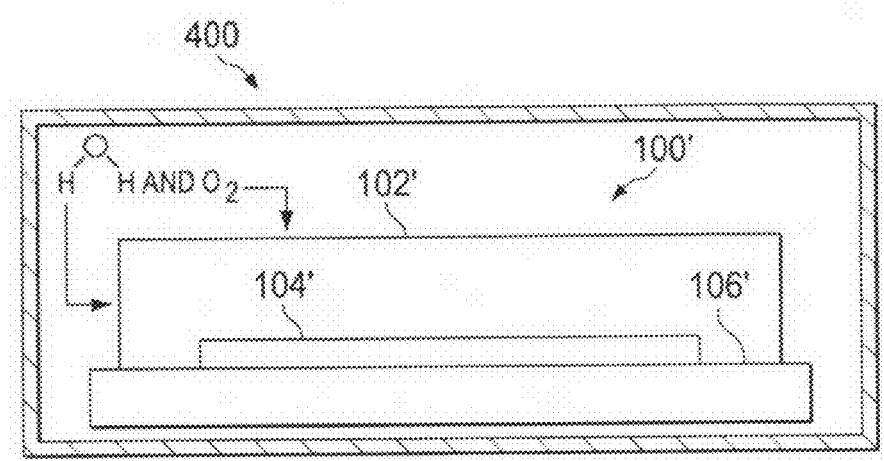
FIG. 4 is a block diagram of an 85° C./85% accelerated-aging chamber/oven which was used to test the hermeticity of the non-heat treated sealed calcium-only patch.

Referring to FIG. 4, there is a block diagram of an 85° C./85% accelerated-aging chamber/oven 400 which was used to test the hermeticity of one sealed calcium-only patch 100' that was made in accordance with the non-heat treatment sealing method 200 of the present invention. The encapsulated calcium-only patch 100' shown was made during an experiment where only one substrate 106' was placed within the single vacuum chamber 300. The resulting encapsulated calcium-only patch 100' was then placed in the oven 400 and subjected to environmental aging at a fixed temperature 85° C. and 85% relative humidity ("85/85 testing"). In the encapsulated calcium-only patch 100', the Ca layer 104' is initially a highly reflecting metallic mirror. And, if water and oxygen penetrate the candidate tin fluorophosphate glass 102', then the metallic Ca 104' would react and turn into an opaque white flaky crust which can be quantified with an optical measurement to estimate the amount of time the encapsulated device 100' could theoretically operate in ambient conditions. For instance, it is believed that if the encapsulated calcium-only patch 100' can survive 1000 hours in the oven 400 then that particular sealing material 102 could be used to seal an OLED display 100 which would then be able to operate for at least five years in normal ambient conditions. In this case, the hermetically sealed device 100 would have an oxygen permeance of less than 0.01 cc/m$^2$/atm/day and a water permeance of less than 0.01 g/m$^2$/day. For details about an earlier version of this calcium patch test which involved the use of an encapsulated calcium layer and aluminum layer to characterize the relative rate of water vapor and oxygen transport through prospective barriers on devices, reference is made to the co-pending U.S. patent application Ser. No. 11/803,512.

Figure 5:
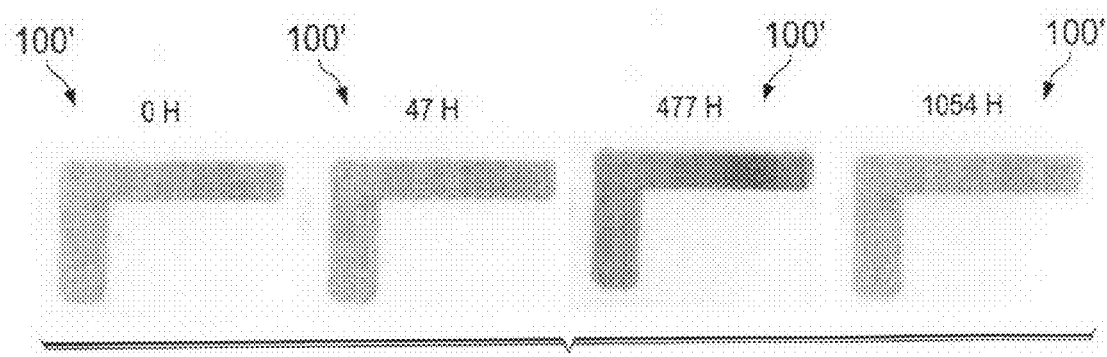
FIG. 5 is a sequence of photos showing the non-heat treated sealed calcium-only patch at different times within the 85° C./85% accelerated-aging chamber/oven which illustrate how well the non-heat treated sealed calcium-only patch was able to inhibit the penetration of oxygen and moisture.

Referring to FIG. 5, there is a time sequence of photos showing one of the L-shaped encapsulated calcium layers 104' on the non-heat treated sealed calcium-only patch 100' at different times within the 85° C./85% accelerated-aging chamber/oven 400. As can be seen, the tested sealed calcium-only patch 100' and in particular the non-heat treated candidate tin fluorophosphate glass 102' was able to inhibit oxygen and moisture penetration while in the 85° C./85% accelerated-aging chamber/oven 400. The numbers indicate the hours the non-heat treated sealed calcium-only patch 100' had endured the 85° C./85% environment. The same system 300 was also later modified and used to make and successfully hermetically seal a homemade OLED.

An important aspect of the non-heat treat sealing method 200 is that a post deposition heat treatment step is not required to manufacture the hermetically sealed device 100. This is desirable since in the past a heat treatment step was performed to remove/minimize defects (e.g., pores) within the deposited sealing material 102 where the defects had formed during the deposition step. But, it was a concern by performing this heat treating that the sealed device 100 and in particular the inner layer(s)/component(s) 104 could be damaged by the heat. Hence, in the co-pending U.S. patent application Ser. Nos. 11/207,691, 11/803,512 and 11/820,855 there was an attempt to reduce the temperature of this heat treatment step to avoid thermally damaging the specific device 100. In fact, in U.S. patent application Ser. No. 11/803,512 it was specifically stated that if SnO was the sealing material 102 then there was no need to perform the heat treatment step. As discussed above, a subsequent experiment was conducted which indicated that a heat treatment step does not need to be performed when using the previously described sealing materials 102.

From the foregoing, it can be readily appreciated by those skilled in the art that the present invention relates to a non-heat treat sealing method 200 used to manufacture a hermetically sealed device 100. The non-heat treat sealing method 200 includes the steps of: (1) positioning the un-encapsulated device 104 and 106 in a desired location with respect to a deposition device 300; and (2) using the deposition device 300 to deposit a sealing material 102 over at least a portion of the un-encapsulated device 104 and 106 to form a hermetically sealed device 100 without having to perform a post-deposition heat treating step. The preferred sealing material 102 is a LLT material 102 or a $Sn^{2+}$-containing inorganic oxide material 102. If desired multiple layers of the same or different types of the sealing materials 102 can be deposited on top of the device 100. As discussed above, the preferred sealing material(s) 102 are specifically suited for inhibiting oxygen or/and moisture degradation which is a common problem to a wide variety of devices 100 including electronic devices, food containers and medicine containers. In addition, the preferred sealing material(s) 102 may be used to reduce, for example, photochemical, hydrolytic, and oxidative damage to a device 100 due to chemically active permeants. Some additional advantages and features of using these particular sealing material(s) 102 are as follows:

The sealing materials 102 may be used to prepare hermetic thin film (~2 μm) barrier layers that fulfill the most stringent impermeability requirements for OLED long-lived operation ($<10^{-6}$ water gm/m$^2$ per day), and may be rapidly sputter-deposited on devices (or substrate materials) at extremely low temperatures (<40° C.). The devices 100 include but are not limited to:

a. Organic electronic devices
    Organic light-emitting diodes (OLED)s
    Organic photovoltaic devices (OPV)s
    Organic Sensors, with or without catalysts
    Flexible substrates for flexible flat panel devices
    Radio frequency identification tags (RFID)s b. Semiconductor electronic devices
    Light-emitting diodes (LED)s
    Photovoltaic devices (PV)s
    Sensors, with or without catalysts
    Flexible substrates for flexible flat panel devices
    Radio frequency identification tags (RFID)s The substrate materials include but are not limited to:

a. Polymer Materials
    Flexible substrates for flexible flat panel devices
    Food packaging
    Medical packaging B. The deposition of organic electronic devices 100 with these particular sealing materials 102 requires no introduction of oxygen or air into the clean environment/cleanroom. The fact that no outside oxidizing source is required to enable the sealing event makes this sealing technique an attractive feature for making organic electronic devices. This is especially true since it is well known that oxygen and moisture are the principal degrading reactants associated with the redox and photo-bleaching degradation reactions which adversely affect the organic layers and/or cathode materials that are located within organic electronic devices like an OLED.

C. Sputter deposition, evaporation, and other thin film deposition processes may be used to deposit the sealing material 102. For example, high rate deposition of $Sn^{2+}$-containing inorganic oxide films 102 may be produced by evaporation of metallic tin in an oxygen containing environment onto a rolling substrate such as plastic at very high speed. Alternatively, reactive DC sputtering of metallic tin in an oxygen environment may be used to produce the desired high rate deposition of a $Sn^{2+}$-containing inorganic oxide film onto a device 100. In fact, there are many different thin film deposition techniques that could be used to deposit the $Sn^{2+}$-containing inorganic oxide film 102 (and the LLT film 102) onto the device 100.

D. The sealing material 102 can be batched with different powders/dopants to create a composition designed to achieve a specific physical-chemical property in the deposited barrier layer. Following is an exemplary list of various dopants that can be mixed with the sealing material 102 to achieve a desired physico-chemical property within the deposited barrier layer:

a. Opacity-Transparency: For instance, SnO is opaque at visible wavelengths, but it may be doped with components such as phosphates to yield transparent films.

b. Refractive Index: Dopants such as $P_2O_5$, $BPO_4$ and $PbF_2$ can be used to alter the refractive index of the sealing material 102 to help optimize, for instance, the light transmission and/or light extraction of the device 100. For example, OLED devices 100 with top emission can be optimized when the air gaps therein are replaced with an index-matched oxide material.

c. Coefficient of Thermal Expansion (CTE): Dopants such as $SnF_2$, $P_2O_5$ and $PbF_2$ can be used to alter the CTE of the sealing material 102 which can help to minimize the different forms of delamination which are commonly associated with "CTE mismatch" problems.

d. Sensitization: Phosphors, quantum dots, inorganic/organic dyes and molecules may be added to confer desired electro-optic characteristics which are useful for device optimization. For instance, dopants such as carbon black can be used to alter the electro-optic character (Fermi level/resistivity) of the sealing material 102 to improve the efficiency of the hermetically sealed device 100 (note: if the Fermi level can be shifted substantially then this might enable one to alter the conductivity of the barrier film in a manner which is analogous to the known indium-tin-oxide (ITO) systems).

e. Alter Solubility and Interface Wettability for Better Adhesion: Doping the sealing material 102 with dopants, such as $SnF_2$, enables one to alter the miscibility of the deposited barrier film. If desired, this concept may be further exploited for adhesion purposes by altering the surface wet-ability of the sealing material 102.

f. Scratch Resistant: Dopants such as SnO, $SnF_2$ and $PbF_2$ may be used to confer a hardness in the sealing material 102 which may be desirable for various devices 100.

E. Pattern-Ability: Sputter deposition, or other thin film deposition methods, allow different patterning techniques to be used, such as shadow masking etc., to produce microstructures having specific dielectric properties to help optimize the operation of the device 100 (e.g., an organic thin film transistor (TFT) device 100 could have insulator gates formed thereon to help achieve a good voltage threshold value).

Although several embodiments of the present invention have been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

The invention claimed is:

1. A method for hermetically sealing a device, said method comprising the steps of:

positioning an un-encapsulated device in a desired location with respect to a deposition device; and using the deposition device to deposit an $Sn^{2+}$-containing inorganic oxide sealing material over at least a portion of the un-encapsulated device to form a hermetically sealed device without performing a post-deposition heat treating step; and wherein the $Sn^{2+}$-containing inorganic oxide sealing material has the following composition, Sn (59-89 wt %);

P (0-13 wt %);

O (6-25 wt %); and

F (0-12 wt %).

2. The method of claim 1, further comprising the step of cooling said device prior to depositing the $Sn^{2+}$-containing inorganic oxide sealing material over said device.

3. The method of claim 1, wherein said deposition device is located within a clean room.

4. The method of claim 1, wherein said deposited $Sn^{2+}$-containing inorganic oxide sealing material has a thickness in a range of about 2 μm.

5. The method of claim 1, wherein said using step includes utilizing a RF sputtering process to deposit the $Sn^{2+}$-containing inorganic oxide sealing material over said device at a deposition rate in a range of about 5 Å/second to about 75 Å/second.

6. The method of claim 1, wherein said hermetically sealed device has an oxygen permeance of less than 0.01 cc/m²/atm/day and a water permeance of less than 0.01 g/m²/day.

7. The method of claim 1, wherein said sealing material is doped with a dopant to achieve a desired specific physical-chemical property including one of the following, or any combination thereof:

an opacity-transparency;

a refractive index;

a coefficient of thermal expansion;

a sensitization;

a fermi level/resistivity;

a solubility/interface wettability; and a hardness.

8. The method of claim 1, wherein said hermetically sealed device is a selected one of:

an organic-electronic device including:

an organic emitting light diode (OLED), a polymer light emitting diode (PLED), a photovoltaic, a metamaterial,
a thin film transistor; and
a waveguide;
an inorganic-electronic device including:
a light emitting diode (LED),
a photovoltaic,
a metamaterial,
a thin film transistor; and
a waveguide;
an optoelectronic device including:
an optical switch;
a waveguide;
a flexible substrate;
a food container; and
a medical container.

9. The method of claim 1, wherein the $Sn^{2+}$-containing inorganic oxide sealing material comprises greater than 80% stannous oxide.

10. The method of claim 1, wherein the $Sn^{2+}$-containing inorganic oxide sealing material is deposited as a single, pore-free layer.

* * * * *

UNITED STATES PATENT AND TRADEMARK OFFICE
CERTIFICATE OF CORRECTION

PATENT NO. : 7,829,147 B2  
APPLICATION NO. : 12/072784  
DATED : November 9, 2010  
INVENTOR(S) : Bruce Gardiner Aitken et al.

Page 1 of 1

It is certified that error appears in the above-identified patent and that said Letters Patent is hereby corrected as shown below:

*Col.*   *Line*

10   45   Claim 5 Please delete the word "scaling" and add the word --sealing--

10   48   Claim 5 Please delete the word "scaled" and add the word --sealed--

Signed and Sealed this  
First Day of February, 2011

David J. Kappos  
*Director of the United States Patent and Trademark Office*